(12) United States Patent
Parks

(10) Patent No.: US 8,035,716 B2
(45) Date of Patent: Oct. 11, 2011

(54) WIDE APERTURE IMAGE SENSOR PIXEL

(75) Inventor: Christopher Parks, Rochester, NY (US)

(73) Assignee: OmniVision Technologies, Inc., Santa Clara, CA (US)

(*) Notice: Subject to any disclaimer, the term of this patent is extended or adjusted under 35 U.S.C. 154(b) by 619 days.

(21) Appl. No.: 12/138,651

(22) Filed: Jun. 13, 2008

(65) Prior Publication Data

US 2009/0310004 A1 Dec. 17, 2009

(51) Int. Cl.
*H04N 3/14* (2006.01)
*H04N 9/083* (2006.01)

(52) U.S. Cl. ......... 348/308; 348/275; 348/279; 348/310

(58) Field of Classification Search .................. 348/280, 348/310
See application file for complete search history.

(56) References Cited

U.S. PATENT DOCUMENTS

| | | | |
|---|---|---|---|
| 5,164,831 A | 11/1992 | Kuchta et al. | |
| 6,252,217 B1 | 6/2001 | Pyyhtia et al. | |
| 7,443,437 B2* | 10/2008 | Altice et al. | 348/296 |
| 7,773,138 B2* | 8/2010 | Lahav et al. | 348/280 |
| 7,838,957 B2* | 11/2010 | Itano et al. | 257/465 |
| 2002/0008767 A1 | 1/2002 | Lee | |
| 2004/0246479 A1* | 12/2004 | Cartlidge et al. | 356/335 |
| 2007/0024879 A1 | 2/2007 | Hamilton, Jr. et al. | |
| 2008/0062290 A1 | 3/2008 | Lahav et al. | |
| 2008/0136933 A1 | 6/2008 | Dosluoglu et al. | |

FOREIGN PATENT DOCUMENTS

EP 1 780 795 A1 5/2007

OTHER PUBLICATIONS

PCT/US2009/003476, International Search Report and the Written Opinion of the International Searching Authority, mail date Sep. 16, 2009 (21pages).

* cited by examiner

*Primary Examiner* — Ngoc-Yen Vu
(74) *Attorney, Agent, or Firm* — Blakely Sokoloff Taylor & Zafman LLP

(57) ABSTRACT

An image sensor includes a unit cell of four pixels. The unit cell includes four photosensitive regions that collect charge in response to light; four transfer transistors that respectively pass the charge from each of the four photosensitive regions to one common charge-to-voltage conversion mechanism; three control wires in which a first control wire controls two of the transfer transistors and a second control wire controls one of the transfer transistors and a third control wire controls one of the transfer transistors; an amplifier connected to the common charge-to-voltage conversion mechanism that outputs an output signal in response to a signal from the charge-to-voltage conversion mechanism; and a reset transistor connected to the common charge-to-voltage conversion mechanism for resetting the charge-to-voltage conversion mechanism to a predetermined signal level.

20 Claims, 9 Drawing Sheets

| R | G | R | G |
|---|---|---|---|
| G | B | G | B |
| R | G | R | G |
| G | B | G | B |

| P | G | P | B |
|---|---|---|---|
| G | P | B | P |
| P | R | P | G |
| R | P | G | P |

| P | P | P | P |
|---|---|---|---|
| G | G | B | B |
| P | P | P | P |
| R | R | G | G |

US 8,035,716 B2

WIDE APERTURE IMAGE SENSOR PIXEL

FIELD OF THE INVENTION

The present invention generally relates to image sensors and more particularly to such image sensors having improved openings between the metal wires covering the photodiode for increasing sensitivity.

BACKGROUND OF THE INVENTION

As pixel sizes are reduced to less than 1.7 µm to meet demand, there are tradeoffs. The primary disadvantages are reduced sensitivity because the pixel area is smaller, and the smaller opening between pixel wires blocks too much light.

For example, referring to FIG. 1, the pixel schematic from U.S. Patent Publication 2008/0062290 A1 is shown. The unit cell has four transfer gates 107, 108, 109, and 110 that control the flow of charge between the floating diffusion and photodiodes 112, 113, 114, and 111, respectively. Transistor 106 resets the floating diffusion to the level of the power supply VDD. Transistor 105 buffers the floating diffusion voltage and the row select transistor 103 switches that voltage onto the output signal line. In this pixel schematic, there are a total of 6 horizontal wires and two vertical wires. If a 1.4 µm pixel size is desired, then the unit cell of 2.8 µm must contain 6 horizontal wires. If the typical metal 2 wire line and space requirement is 0.18 µm, then those 6 wires will occupy 1.80 µm out of 2.8 µm leaving only a 1.0 µm hole for two photodiodes in the pixel unit cell. A 0.5 µm opening for each photodiode is smaller than the wavelength of red light (650 nm). As a result, the pixel quantum efficiency will be very poor.

The opening in the metal wires could be made larger by using 3 or more layers of metal. Camera lenses for cell phones typically have light rays that may be incident at an angle of 25 degrees from normal. A tall stack of metal wires 3 or more layers high will block light incident at 25 degrees from reaching the photodiodes.

The present invention will address the problem of narrow openings between metal wires above photodiodes while at the same time permitting improved sensitivity by summing pixels in low resolution imaging modes.

SUMMARY OF THE INVENTION

An image sensor includes a unit cell of four pixels. The unit cell includes four photosensitive regions that collect charge in response to light; four transfer transistors that respectively pass the charge from each of the four photosensitive regions to one common charge-to-voltage conversion mechanism; three control wires in which a first control wire controls two of the transfer transistors and a second control wire controls one of the transfer transistors and a third control wire controls one of the transfer transistors; an amplifier connected to the common charge-to-voltage conversion mechanism that outputs an output signal in response to a signal from the charge-to-voltage conversion mechanism; and a reset transistor connected to the common charge-to-voltage conversion mechanism for resetting the charge-to-voltage conversion mechanism to a predetermined signal level.

It is an object of the present invention to increase the area of the opening above the photodiode while at the same time permitting improved sensitivity by summing pixels in low resolution imaging modes.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of increasing the area of the opening covering the photodiode for improved sensitivity of the photodiode.

DETAILED DESCRIPTION OF THE INVENTION

Figure 2:
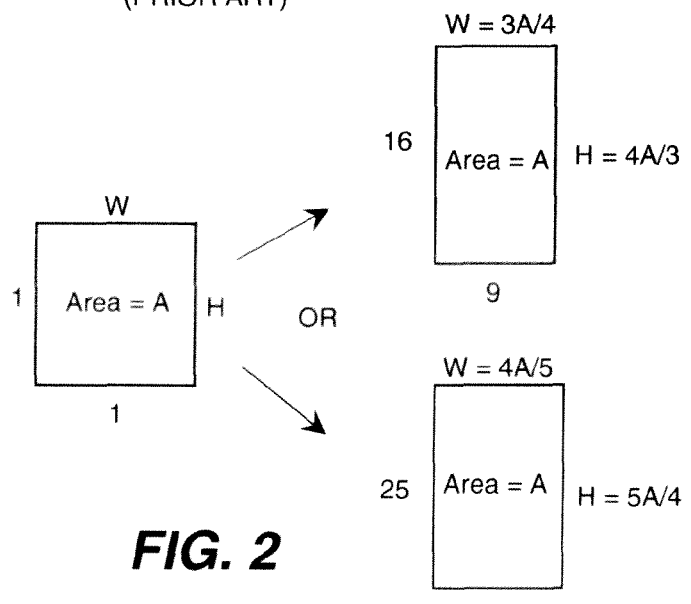
FIG. 2 illustrates the area and shape of the unit cell configuration of the present invention.

The present invention will first disclose the structure of a pixel with increased area of the opening between wires covering the photodiode. Referring to FIG. 2, the typical pixel has equal width, W, and height, H. So a 1.4 µm pixel is 1.4 µm square. There is no fundamental requirement that pixels must be square. The pixel aspect ratio can be changed so it has a height greater than width. This aspect ratio spaces out the horizontal wires. It reduces the space between vertical wires, but there are fewer vertical wires than horizontal wires. Therefore, there is a net increase in the opening for light between metal wires with a rectangular shaped pixel.

Figures 3, 4, 5, 6:
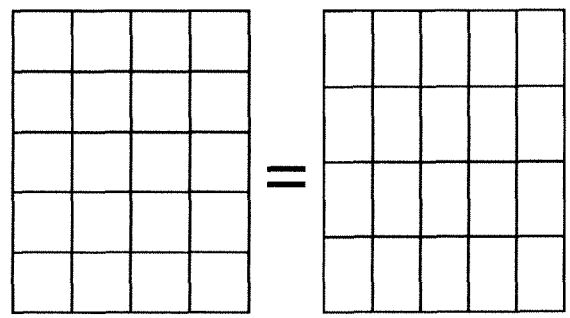
FIG. 3 illustrates the unit cell pixel configuration of the present invention having rectangular shaped pixels versus conventional square pixels.
FIG. 4 illustrates a Bayer color filter arrangement of the prior art.
FIG. 5 illustrates a pan-chromatic color filter arrangement of the prior art using pan-chromatic filters.
FIG. 6 illustrates another pan-chromatic color filter arrangement of the prior art using pan-chromatic filters.

With rectangular pixels in the image sensor, the camera will use image processing to transform the rectangular pixels of the image sensor into one with square pixels for display. It is desirable to make the aspect ratio of the pixel be the ratio of two perfect squares such as 16:9 or 25:16 and other similar aspect ratios. Referring to FIG. 3, this makes the image processing algorithm for generating square pixels easier. The left side of FIG. 3 is an array of square pixels with 5 rows and 4 columns. If the rectangular pixel has an aspect ration of 25 by 16, two perfect squares, then an array of rectangular pixels having 4 rows and 5 columns has exactly the same number of pixels and same area as the array of square pixels. Therefore both rectangular and square array layouts are equal in pixel count. The rectangular array has less vertical resolution, but it also has greater horizontal resolution than the square array.

The generalized case would be a rectangular pixel having a width $$W = \frac{n}{n+1}A,$$

and a height $$H = \frac{n+1}{n}A,$$

where A is the desired area of the pixel and n is an integer. The aspect ratio of the pixel would be $$\frac{H}{W} = \left(\frac{n+1}{n}\right)^2.$$

The width and height of the rectangular pixel is not limited to those values, but those values allow for implementation of simple image processing algorithms. Consider the 1.4 μm pixel as an example. For an aspect ratio of 25:16 (n=4) the width is 1.12 μm and height is 1.75 μm. For the case of six 0.18 μm horizontal metal wires, this adds 0.35 μm onto the 0.5 μm metal opening to make it 0.85 μm. This is a significant improvement.

Figure 1:
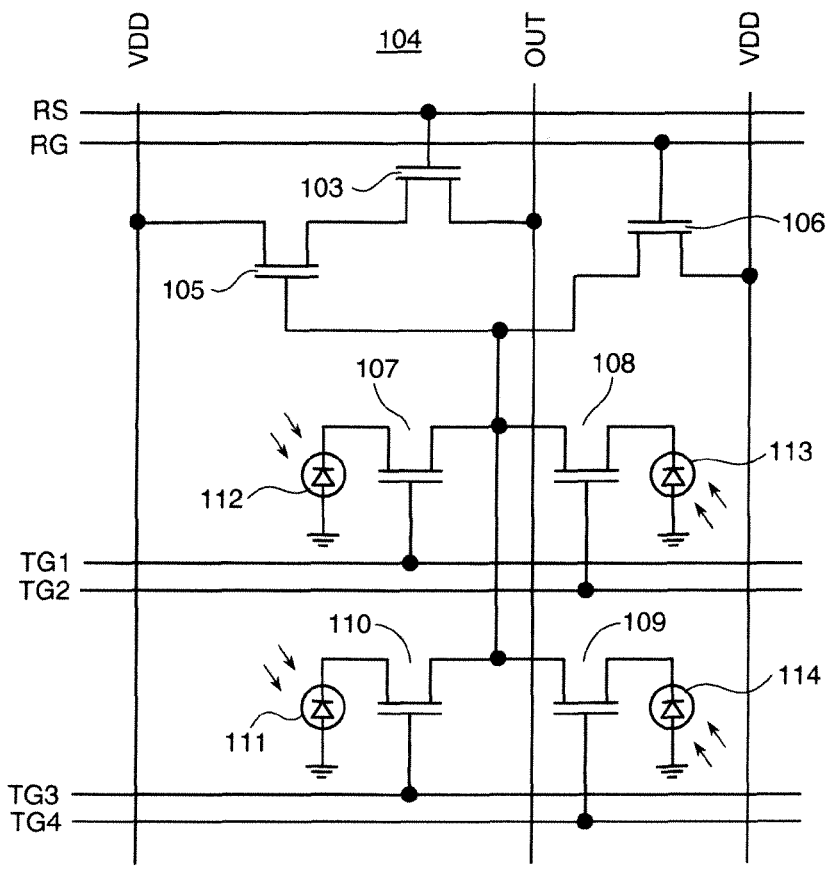
FIG. 1 is a schematic diagram of a prior art image sensor.

Further improvement can be obtained by realizing that the row select transistor 103 of FIG. 1 can be eliminated by clocking the VDD power supply and using the reset transistor 106 as a row selector. This eliminates the RS horizontal wire.

It is noted the present invention includes color filter layouts that can eliminate another horizontal wire. FIG. 4 shows the traditional Bayer color filter pattern used by a majority of color image sensors. Pixel summing is difficult with this pattern and each pixel can receive only one color. Color filter patterns using red, green, blue, and pan-chromatic pixels were described in U.S. Patent Publication 2007/0024879 A1 and reproduced in FIGS. 5 and 6. For both patterns in FIGS. 5 and 6, the pixel unit cell would contain two pan-chromatic pixels and two color pixels. The pan-chromatic pixels form a high-resolution luminance component of the final image that is superior to the green color channel of the Bayer pattern. The pan-chromatic pixel patterns leverage the fact that the human eye is more sensitive to luminance resolution than it is to color resolution. The pixel architecture can also leverage this fact by summing together the two color pixels within the 4-pixel unit cell. There is a noise advantage to summing the color pixels in the charge domain on the pixel floating diffusion instead of in the digital domain after each of the 2 color pixels have been digitized.

Figure 7:
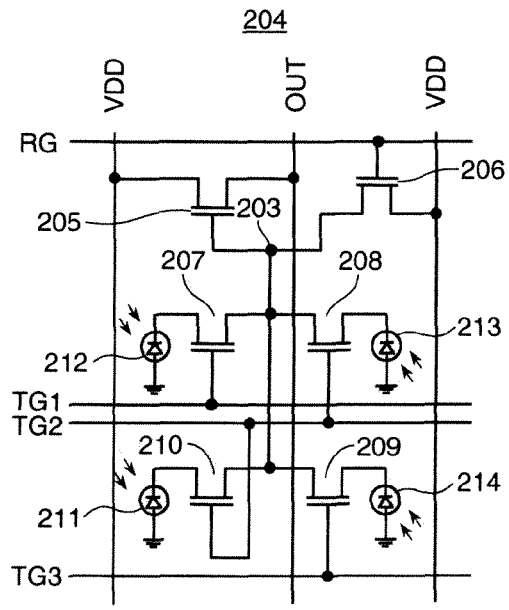
FIG. 7 is a schematic diagram of a unit cell of the present invention.

FIG. 7 shows the schematic for an embodiment of the present invention. This is designed to work with the color filter pattern shown in FIG. 5. This schematic is of a unit cell 204 having two transfer gates 208 and 210 that are controlled by the same control wire TG2. The transfer gates 208 and 210 transfer charge from the photosensitive regions, preferably photodiodes, 211 and 213 that collect charge in response to incident light. Photodiodes 213 and 211 are under either red, green, or blue color filters, and their charges are summed together on the charge-to-voltage conversion mechanism, preferably a floating diffusion, 203 when TG2 is activated. Photodiodes 212 and 214 are under pan-chromatic filters and are independently transferred to the floating diffusion 203 when transfer gates 207 or 209 are activated. Transistor 206 resets the floating diffusion 203 to the level of the power supply voltage VDD. Transistor 206 also serves as a row select transistor. The amplifier transistor 205 buffers the floating diffusion 203 voltage onto the output signal wire Out. This unit cell pixel 204 has a design with only four wires in the horizontal direction. Using the previous example of a rectangular 1.4 μm pixel with a 1.75 μm height and 0.18 μm horizontal metal wires, the opening between pairs of metal wires is now 1.21 μm. That more than doubles the prior art metal opening of 0.5 μm. Therefore, the quantum efficiency of the invention is much higher than the prior art.

Figure 8:
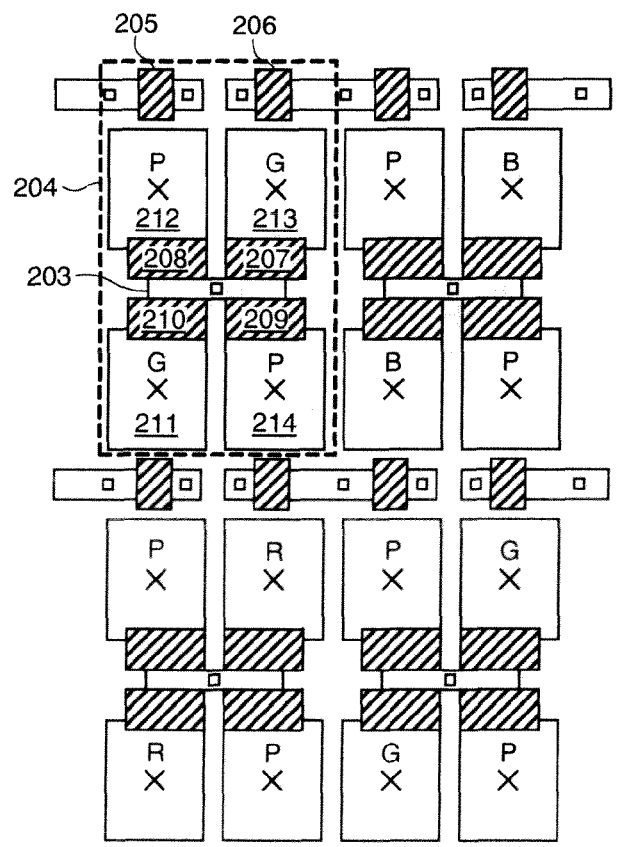
FIG. 8 is a layout of the unit cell of FIG. 7.

FIG. 8 shows the silicon layout of the unit cell 204 having four pixels. The four transfer gates 207 through 210 are symmetrically arranged about the floating diffusion 203. The transistors 205 and 206 are placed on the other side of the photodiodes. This pixel 204 layout provides regularly spaced photodiodes in the horizontal and vertical directions with their optical centers marked by X. The regularly spaced photodiodes are important for maintaining optical symmetry for light incident at an angle.

Figure 9:
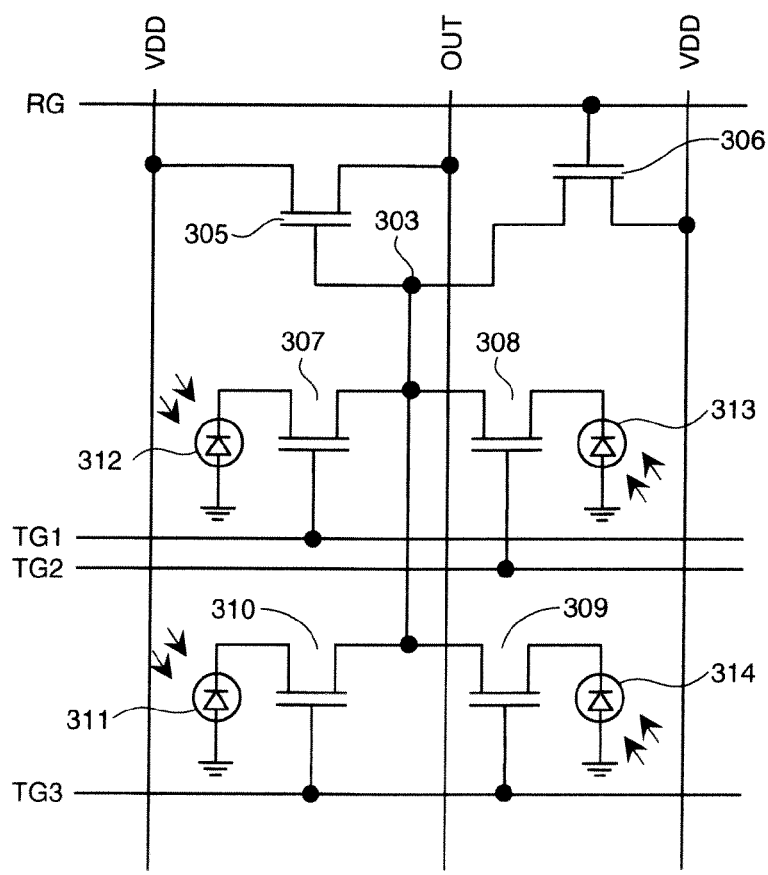
FIG. 9 is alternative embodiment a unit cell of the present invention.

FIG. 9 shows the schematic for an alternative embodiment of the present invention that is designed to work with the color filter pattern shown in FIG. 6. This schematic is of a unit cell 304 having two transfer gates 309 and 310 controlled by the same control wire TG3. The transfer gates 309 and 310 transfer charge from the photodiodes 311 and 314 that collect charge in response to incident light. Photodiodes 311 and 314 are under either red, green, or blue color filters and their charges are summed together on the floating diffusion 303 when TG2 is activated. Photodiodes 312 and 313 are under pan-chromatic filters and are independently transferred to the floating diffusion 303 when transfer gates 307 or 308 are activated. Transistor 306 resets the floating diffusion 303 to the level of the power supply voltage VDD. Transistor 306 also serves as a row select transistor. Amplifier transistor 305 buffers the floating diffusion 303 voltage onto the output signal wire Out. This pixel 304 has a design with only four wires in the horizontal direction. Using the previous example of a rectangular 1.4 μm pixel with a 1.75 μm height and 0.18 μm horizontal metal wires, the opening between pairs of metal wires is now 1.21 μm. That more than doubles the prior art metal opening of 0.5 μm. Therefore, the quantum efficiency of the invention is much higher than the prior art.

Figure 10:
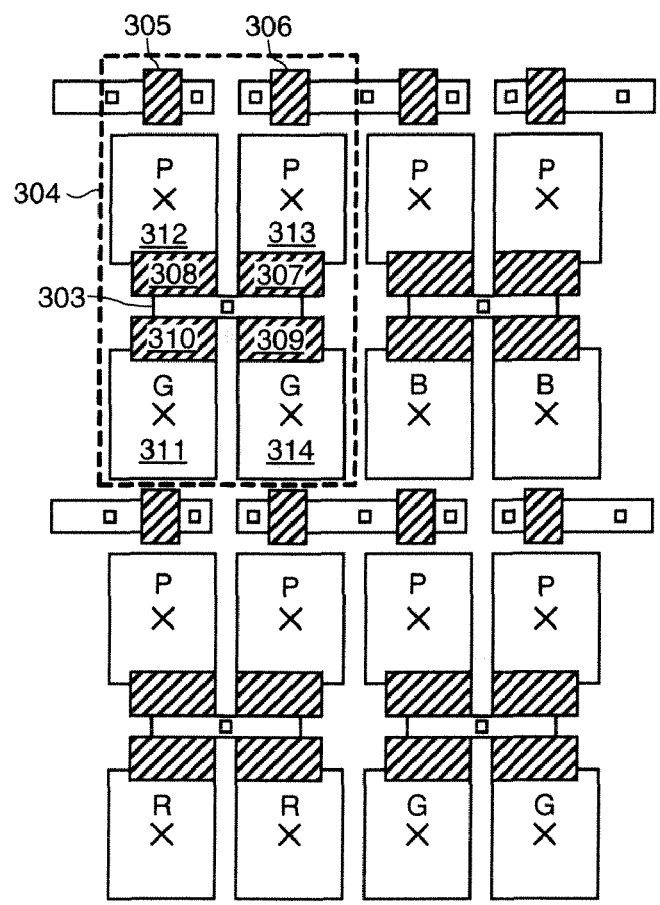
FIG. 10 is a layout of the schematic of FIG. 9.

FIG. 10 shows the silicon layout of the unit cell 304 of FIG. 9 which also include 4 pixels. The four transfer gates 307 through 310 are symmetrically arranged about the floating diffusion 303. The transistors 305 and 306 are placed on the other side of the photodiodes. This pixel 304 layout provides regularly spaced photodiodes in the horizontal and vertical directions with their optical centers marked by X. The regularly spaced photodiodes are important for maintaining optical symmetry for light incident at an angle. Because the pan-chromatic pixels are all in one row, a cylindrical microlens can be used to focus light on the photodiodes.

Figure 11:
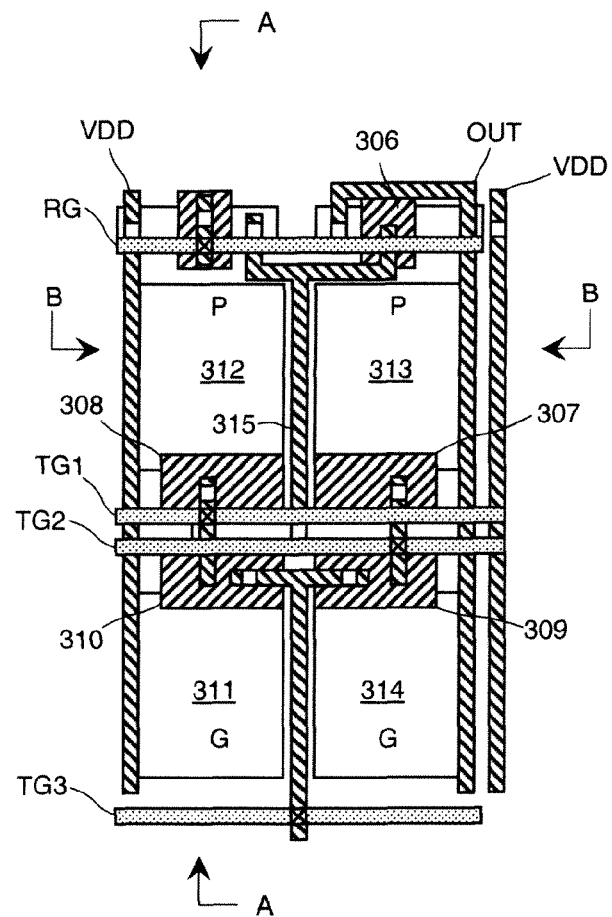
FIG. 11 illustrates the metal wiring overlaid on top of FIG. 10.

FIG. 11 shows the metal wiring overlaid on top of FIG. 10. The four horizontal wires TG1, TG2, TG3, and RG are arranged in pairs of two overtop of the boundary between rows of photodiodes. This provides the maximum opening between wires for passage of light to the photodiodes. Vertical wires Out and VDD are fabricated on a different level of metallization.

Figure 12:
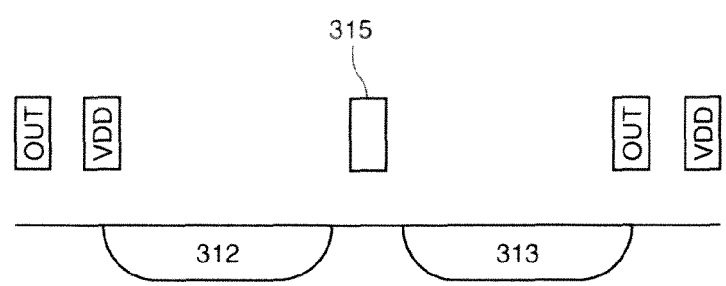
FIG. 12 shows horizontal cross-section B-B of FIG. 11.

FIG. 12 shows horizontal cross-section B-B of FIG. 11. Of particular advantage of this pixel layout is the horizontal cross-section B-B only has one layer of metal for minimal obstruction of incoming light. The wires alternate between one floating diffusion 315 wire between photodiodes and two wires Out and VDD between the next pair of photodiodes.

This does introduce an optical left night asymmetry that can be mitigated by making the floating diffusion wire 315 wider.

Figure 13:
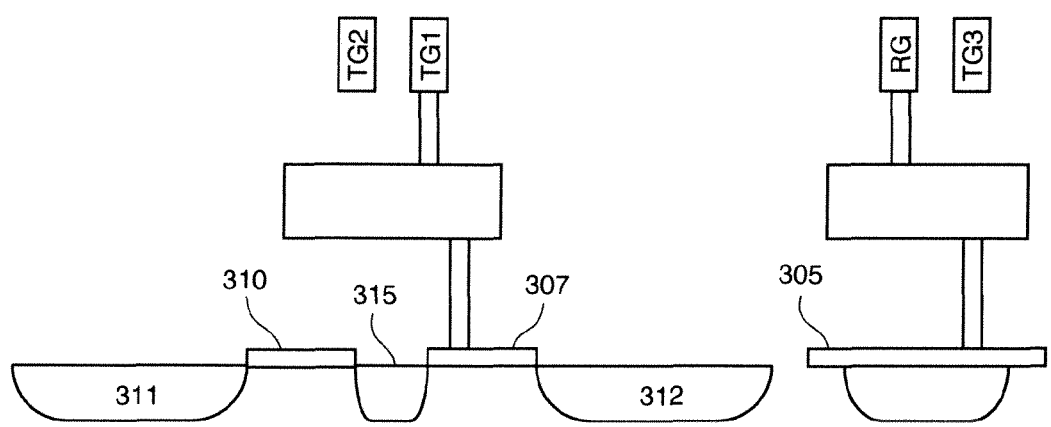
FIG. 13 shows vertical cross-section A-A of FIG. 11.

FIG. 13 shows vertical cross-section A-A of FIG. 11. This cross-section shows the TG1, TG2, TG3, and RG wires on a second layer of metal. The longer side of the rectangular pixel is arranges along this cross-section to maximize the opening between the second level metal wires.

The first embodiment of the invention has a similar wiring arrangement as shown in FIGS. 11, 12, and 13.)

Both embodiments of the invention can be fabricated as NMOS pixels where electrons are the charge carriers, or as PMOS pixels where holes are the charge carriers.

Figure 14:
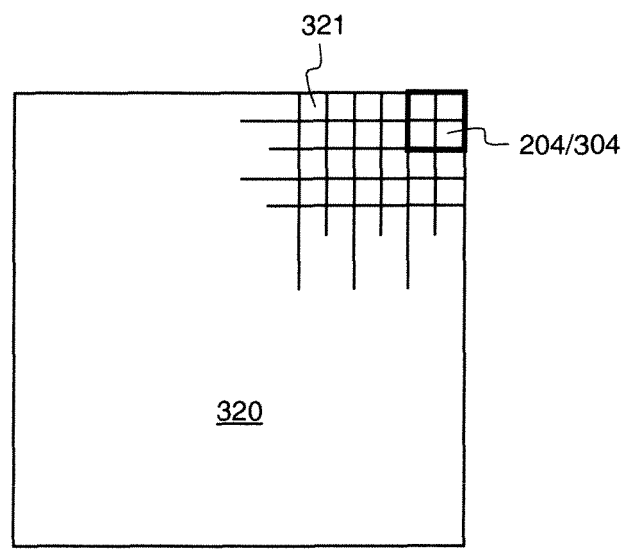
FIG. 14 is a top view of an image sensor of the present invention.

FIG. 14 is a top view of the image sensor 320 of the present invention having a plurality of pixels 321 that arranged in a two dimensional array. The pixels 321 are electronically grouped in the unit cells 204 and 304. Each unit cell 204 and 304 contains four pixels. For the present invention unit cell is defined as four pixels.

Figure 15:
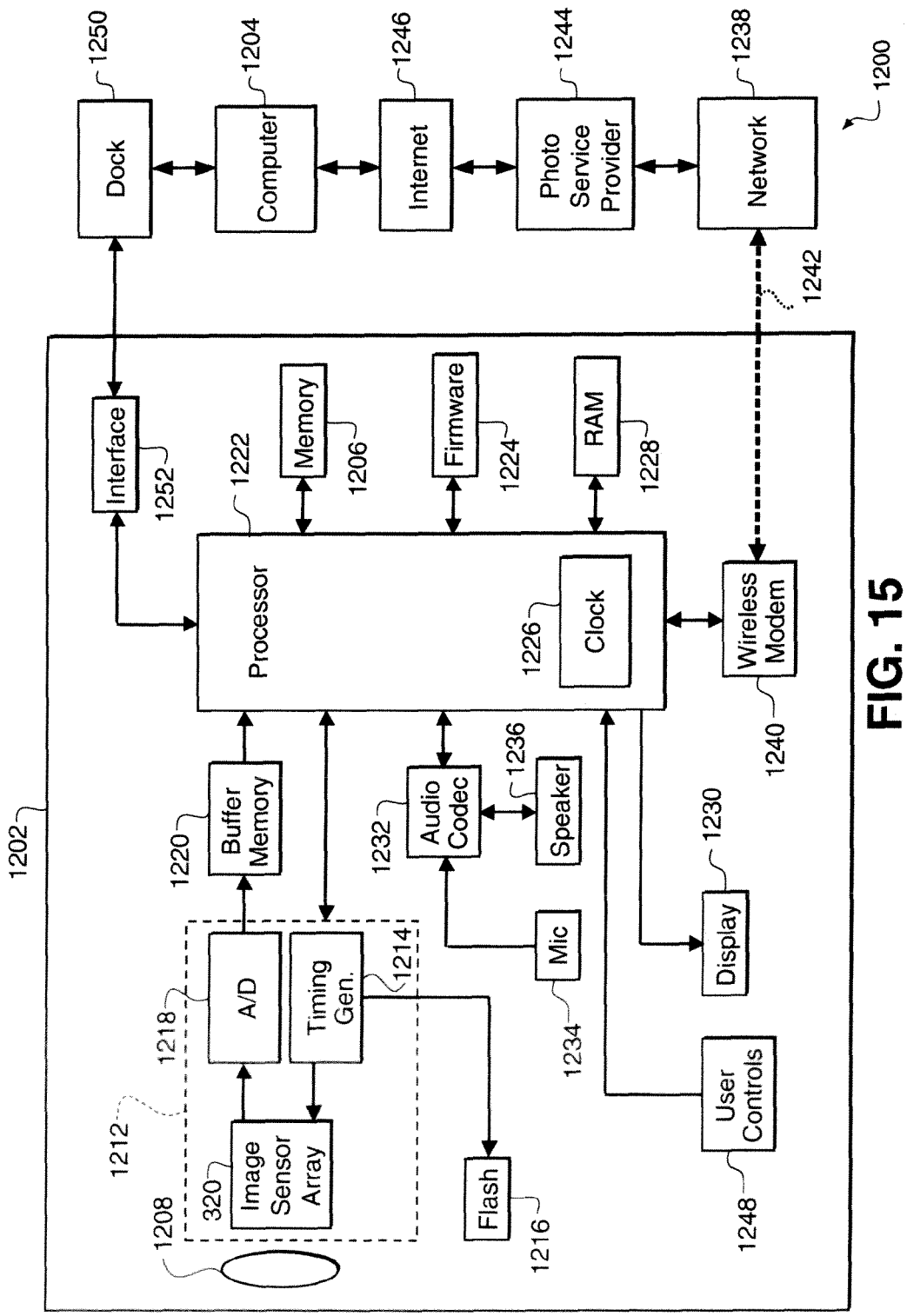
FIG. 15 shows a block diagram of an image capture device having the image sensor of the present invention.

FIG. 15 is a block diagram of an imaging system that can be used with an image sensor that incorporates the pixel structure in accordance with the invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses lens 1208 to focus light from a scene (not shown) onto image sensor array 320 of imaging integrated circuit 1212. Image sensor array 320 provides color image information using the Bayer color filter pattern in an embodiment in accordance with the invention. Image sensor array 320 is controlled by timing generator 1214, which also controls flash 1216 in order to illuminate the scene when the ambient illumination is low.

The analog output signals output from the image sensor array 320 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 1228 and supplied to display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor array 320 together (e.g. summing pixels of the same color within each 4 column×4 row area of the image sensor array 320) to create a lower resolution video image frame. The video image frames are read from image sensor array 320 at regular intervals, for example, using a 15 frame per second readout rate.

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1250 recharges the batteries (not shown) in digital camera phone 1202. Dock 1250 connects digital camera phone 1202 to computing device 1204 via dock interface 1252. Dock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described in detail with particular reference to certain preferred embodiments thereof, but it will be understood that variations and modifications can be effected within the spirit and scope of the invention.

PARTS LIST

107 transfer gate
108 transfer gate
109 transfer gate
110 transfer gate
111 photodiodes
112 photodiodes
113 photodiodes
114 photodiodes
203 floating diffusion
204 unit cell
205 amplifier
206 reset transistor
207 transfer gate
208 transfer gate
209 transfer gate
210 transfer gate
211 photodiodes
212 photodiodes
213 photodiodes
214 photodiodes
303 floating diffusion
304 unit cell
305 amplifier
306 reset transistor
307 transfer gate
308 transfer gate
309 transfer gate
310 transfer gate
311 photodiodes
312 photodiodes PARTS LIST (con't)
313 photodiodes
314 photodiodes
320 image sensor
321 pixels
1200 imaging system
1202 digital camera phone
1204 computing device
1206 memory
1208 lens
1212 imaging integrated circuit
1214 timing generator
1216 flash
1218 A/D converter circuit
1220 buffer memory
1222 digital processor
1224 firmware memory
1226 clock
1228 RAM memory
1230 color display
1232 audio codec
1234 microphone
1236 speaker
1238 mobile phone network
1240 wireless modem
1242 RF Channel
1244 photo service provider
1246 Internet
1248 user controls
1250 dock
1252 dock interface

The invention claimed is:

1. An image sensor comprising:
a plurality of pixels comprising:
a unit cell of four pixels comprising:
 a) four photosensitive regions that collect charge in response to light;
 b) four transfer transistors that respectively pass the charge from each of the four photosensitive regions to one common charge-to-voltage conversion mechanism;
 c) first, second and third control wires in which the first control wire controls two of the transfer transistors and a second control wire controls one of the transfer transistors and a third control wire controls one of the transfer transistors;
 d) a transistor connected to the common charge-to-voltage conversion mechanism that outputs an output signal in response to a signal from the charge-to-voltage conversion mechanism; and
 e) a reset transistor connected to the common charge-to-voltage conversion mechanism for resetting the charge-to-voltage conversion mechanism to a predetermined signal level.

2. The image sensor as in claim 1 wherein the photosensitive region is a photodiode.

3. The image sensor as in claim 2 wherein the charge-to-voltage conversion mechanism is a floating diffusion.

4. The image sensor as in claim 3 wherein the two photodiodes, which have their associated transfer transistor connected to the first control wire, are covered with the same color.

5. The image sensor as in claim 4 further comprising each pixel of the unit cell is rectangular shaped.

6. The image sensor as in claim 5 further comprising an aspect ratio which is equal to the ratio of two perfect square numbers.

7. The image sensor as in claim 4 wherein the remaining two photodiodes are covered by a pan-chromatic color.

8. The image sensor as in claim 7 further comprising an aspect ratio which is equal to the ratio of two perfect square numbers.

9. The image sensor as in claim 4 further comprising a power supply and output that are positioned on a first metal layer, and the three control wires are positioned on a second metal layer.

10. The image sensor as in claim 4 further comprising an area of each pixel that is less than $4\mu m^2$.

11. An image capture device comprising:
an image sensor comprising:
a plurality of pixels comprising:
a unit cell of four pixels comprising:
 a) four photosensitive regions that collect charge in response to light;
 b) four transfer transistors that respectively pass the charge from each of the four photosensitive regions to one common charge-to-voltage conversion mechanism;
 c) first, second and third control wires in which the first control wire controls two of the transfer transistors and the second control wire controls one of the transfer transistors and the third control wire controls one of the transfer transistors;

d) a transistor connected to the common charge-to-voltage conversion mechanism that outputs an output signal in response to a signal from the charge-to-voltage conversion mechanism; and e) a reset transistor connected to the common charge-to-voltage conversion mechanism for resetting the charge-to-voltage conversion mechanism to a predetermined signal level.

12. The image capture device as in claim 11 wherein the photosensitive region is a photodiode.

13. The image capture device as in claim 12 wherein the charge-to-voltage conversion mechanism is a floating diffusion.

14. The image capture device as in claim 13 wherein the two photodiodes, which have their associated transfer transistor connected to the first control wire, are covered with the same color.

15. The image capture device as in claim 14 further comprising each pixel of the unit cell is rectangular shaped.

16. The image capture device as in claim 15 further comprising an aspect ratio which is equal to the ratio of two perfect square numbers.

17. The image capture device as in claim 14 wherein the remaining two photodiodes are covered by a pan-chromatic color.

18. The image capture device as in claim 17 further comprising an aspect ratio which is equal to the ratio of two perfect square numbers.

19. The image capture device as in claim 14 further comprising a power supply and output that are positioned on a first metal layer, and the three control wires are positioned on a second metal layer.

20. The image capture device as in claim 14 further comprising an area of each pixel that is less than $4\mu m^2$.

* * * * *